United States Patent
Okuyama et al.

(10) Patent No.: US 10,379,162 B1
(45) Date of Patent: Aug. 13, 2019

(54) SYSTEM FOR PERFORMING MODULATION ANALYSIS WITHOUT USING A MODULATED SIGNAL

(71) Applicant: Keysight Technologies, Inc., Minneapolis, MN (US)

(72) Inventors: Sho Okuyama, Kobe (JP); Mitsuru Yokoyama, Kobe (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/799,951

(22) Filed: Oct. 31, 2017

(51) Int. Cl.
*G01R 31/319* (2006.01)
*H04L 27/20* (2006.01)
*H04L 27/00* (2006.01)

(52) U.S. Cl.
CPC .... *G01R 31/31903* (2013.01); *H04L 27/2057* (2013.01); *H04L 2027/0065* (2013.01); *H04L 2027/0075* (2013.01)

(58) Field of Classification Search
CPC ......... H04L 27/2057; H04L 2027/0075; H04L 2027/0065; G01R 31/31903
See application file for complete search history.

(56) References Cited

U.S. PATENT DOCUMENTS

| 6,211,663 | B1* | 4/2001 | Moulthrop | G01R 31/2822 324/615 |
| 6,504,425 | B1 | 1/2003 | Kim | |
| 7,652,532 | B2 | 1/2010 | Li | |
| 7,792,181 | B2 | 9/2010 | Yamanouchi | |
| 2006/0222062 | A1* | 10/2006 | Kadota | G01R 31/3191 375/224 |
| 2007/0165702 | A1* | 7/2007 | Yokoyama | H04B 1/707 375/147 |
| 2009/0180527 | A1* | 7/2009 | Asami | H04L 27/34 375/226 |
| 2014/0242919 | A1* | 8/2014 | Matsumoto | H04W 24/06 455/67.14 |

(Continued)

FOREIGN PATENT DOCUMENTS

CN 102857304 B 8/2016

OTHER PUBLICATIONS

Guan, Junqing, et al., Iterative Characterisation Approach Using Realistic Excitation Signals for Linearisation of Transmitters, 2017 IEEE, pp. 197-200.

(Continued)

*Primary Examiner* — Jean B Corrielus

(57) ABSTRACT

A method for operating a data processing system to compute the response of a DUT to a modulated input signal is disclosed. The method includes determining a set of parameters for a first model of the DUT from a plurality of measurements of output values from the DUT, each output value includes a measurement of a gain and phase shift provided by the DUT when the DUT is stimulated with a single tone input signal having a frequency in a frequency range determined by the modulated signal. The method also determines a second model that characterizes noise generated by the DUT at the single tone input signals. A performance parameter for an output signal that would be obtained by applying the modulated input signal to an input of the DUT, and receiving the output of the DUT is then determined from the first and second models.

10 Claims, 2 Drawing Sheets

(56) References Cited

U.S. PATENT DOCUMENTS

2016/0076914 A1* 3/2016 Gotz .................. G01D 5/24476
702/150
2017/0111127 A1* 4/2017 VanWiggeren ........ H04B 17/15

OTHER PUBLICATIONS

Yamanouchi, Shingo, et al., OFDM Error Vector Magnitude Distortion Analysis, IEICE Trans. Electron., vol. E89-C, No. 12 Dec. 2006, pp. 1836-1842.

* cited by examiner

SYSTEM FOR PERFORMING MODULATION ANALYSIS WITHOUT USING A MODULATED SIGNAL

BACKGROUND

Electronic devices, such as amplifiers and frequency converters (mixers), used in modern communication systems are qualified through a variety of measurements. Some of the measurements are performed with the device being stimulated by modulated signals to reproduce conditions where the device under test (DUT) is used. Response of the device to the stimulus is captured and analyzed. Error vector magnitude (EVM) and adjacent channel power ratio (ACPR) measurements are typical examples of this class of measurements. For those measurements, vector signal generators (VSG) and vector signal analyzers (VSA) are usually used to transmit and receive the modulated signals. With the increase in the carrier frequency and modulation bandwidth of modern communication standards, demands for the measurement instruments are increasing, resulting in high cost for measurement equipment. In addition, noise of the measurement instruments limits a lower bound of measurable range for performance parameters such as EVM and ACPR. It is difficult to increase the measurable range only by improving hardware performance.

SUMMARY

The present invention includes a method for operating a data processing system to compute the response of a DUT to a modulated input signal and a computer readable medium having instructions that cause a data processing system to execute that method when the instructions are executed by the data processing system. The method includes determining a set of parameters for a first model of the DUT from a plurality of measurements of output values from the DUT, each output value includes a measurement of a gain and phase shift provided by the DUT when the DUT is stimulated with a single tone input signal having a frequency in a frequency range determined by the modulated signal. The method also determines a second model that characterizes noise generated by the DUT at the single tone input signals. A performance parameter for an output signal that would be obtained by applying the modulated input signal to an input of the DUT, and receiving the output of the DUT is then determined.

In one aspect of the invention, the first model includes a complex polynomial series, the parameters being the coefficients in the series.

In another aspect, the second model includes a noise figure or noise factor of the DUT.

In another aspect, the performance parameter includes an EVM measurement for the modified modulated signal.

In another aspect, the performance parameter includes an ACPR measurement for the modified modulated signal.

DETAILED DESCRIPTION

Figure 1:
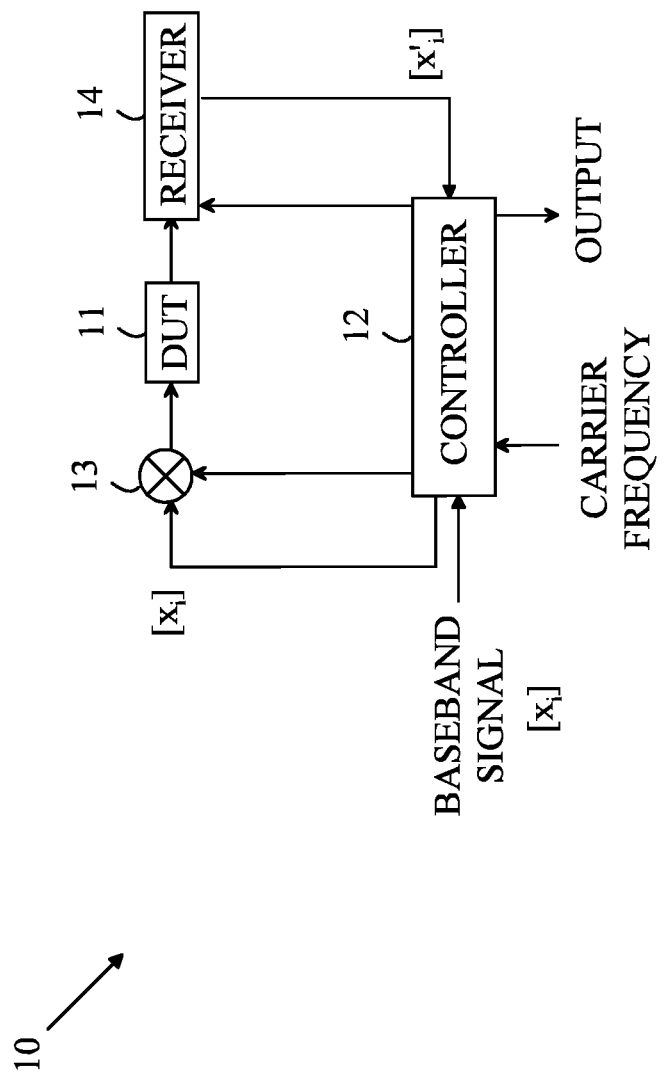
FIG. 1 illustrates an experimental setup for measuring the EVM introduced by a DUT into a baseband signal that up-converted to a carrier frequency.

The manner in which the present invention provides its advantages can be more easily understood with reference to FIG. 1, which illustrates a experimental setup 10 for measuring the EVM introduced by a DUT 11 into a baseband signal that up-converted to a carrier frequency. The baseband signal consists of a sequence of signal amplitude values, $x_i$, for i=1 to $N_b$. This baseband is input to a controller 12 which up-converts the baseband signal to a carrier frequency with the aid of mixer 13. The output of mixer 13 is applied to DUT 11. The output of DUT 11 is then sent to a receiver 14, which down-converts the signal to recover a modified baseband signal, $x'_i$, for i=1 to $N_b$. The controller then computes an EVM measure from the original and modified baseband signals. The DUT introduces distortion and noise into the output signal, and contributions of the distortion and noise to the performance parameters are evaluated.

The lower bound of the measurable range for the performance parameters is limited by the noise of the measurement instruments, and the noise of the measurement instrument is usually much higher than that of the DUT. Therefore, actual characteristics of the DUT are hidden by the noise of the measurement instrument. In addition, EVM and ACPR measurements require a VSG and a receiver capable of operating at the carrier frequency, which increases the cost of the measurement setup.

The present invention overcomes these challenges by characterizing a DUT with simpler parameters a single tone that is less affected by the instrument noise and measurable with less expensive instruments. The resulting characterization is then used to calculate the performance parameters from these simpler parameters. The distortion introduced by the non-linearities of the DUT is represented by the gain and phase shift introduced by the DUT as a function of the input signal level to the DUT at the carrier frequency. The noise of the DUT is represented by noise figure or noise factor. Once these parameters are determined, an output from the DUT can be calculated for any given baseband signal without the need to up-convert the baseband signal.

The DUT is characterized by measuring the gain and phase shift introduced by the DUT as a function of input signal amplitude for a single tone signal at the carrier frequency. The gain is the absolute value of the output signal amplitude divided by the input signal amplitude. The phase shift is the difference between the phase of the output signal and the phase of the input signal. It is assumed that the gain and phase shift introduced by the DUT depend only on the input signal amplitude at the carrier frequency. This characterization procedure can be repeated at a number of different carrier frequencies to allow measurements to be subsequently calculated for different carrier frequencies as well as for different baseband signals.

For the purposes of the present discussion, it will be assumed that the characterization data is fit to a continuous function C(x) that provides the complex output from the DUT for a baseband input of x. The particular functional form C(x) will be discussed in more detail below; however, the present invention does not rely on a specific model for the characterization data. In one aspect of the invention, there is one such function for each carrier frequency of interest. Alternatively, a single function that depends both on x and the carrier frequency could be provided.

The manner in which the characterization function is used to predict the result of an EVM measurement for a particular baseband signal will now be discussed. Initially, it will be assumed that the DUT does not introduce a significant amount of noise into the measurement. The manner in which the contribution of the noise to the EVM is calculated will be discussed in more detail below.

By definition, EVM is the average power in the error vector divided by the average power of the output signal. The result can be expressed in decibels or as a percentage. For any given input value x to the DUT, the power in the error vector, $P_e$ is given by $$P_e = |C(x) - gx|^2$$

The error vector is the vector that connects two points in the complex plain. The first point is the value obtained from the device for an input, x, and the second is the ideal value that would be obtained if the device did not suffer from a gain compression. In general, the DUT will be characterized by a gain as a function of the input signal that is constant for small input signals and decreases at high values of the input signal. Hence, the ideal point in the complex plain is gx where x is the complex input signal value and g is the absolute value of the gain as measured in the constant gain region of the gain compression curve. The reference power is $|gx|^2$. Here, $C(x)$ is the nonlinearity characterization function at the carrier frequency as described above and g is the absolute value of the gain of the DUT in the small signal region of $C(x)$. Accordingly, the EVM contribution from the non-linearity of the DUT from a baseband signal, $x_1$, is given by $$P_e = \frac{1}{Np} \sum_{i=1}^{Np} |C(x_i) - gx_i|^2$$

The average value of the power in the output signal, $P_r$, is given by $$P_r = \frac{1}{Np} \sum_{i=1}^{Np} |gx_i|^2$$

Hence, the contribution to the EVM from the non-linearity of the device is given by $$EVM_{nl}(dB) = 10 \log(p_e/p_r)$$

$$EVM_{nl}(\%) = 100 * P_e/P_r$$

The EVM values obtained above do not include the contribution of noise generated in the DUT. In one aspect of the invention, the contribution of noise from the device is also taken into calculation. The output noise power of the device is characterized by terminating the input of the device by an impedance matched load at a temperature of 290 K and measuring the output power of the device at the carrier frequency with the frequency bandwidth equal to that of the baseband signal ($P_n$). The contribution to the EVM from the noise is given by $$EVM_{noise}(\%) = 100\sqrt{P_n/P_r}$$

Alternatively, with noise factor (F), $$EVM_{noise}(\%) = 100\sqrt{k_B T_0 F B g^2/P_r}$$

Here, KB is the Boltzmann constant, $T_0$ is 290° K, F is the noise factor, B is the bandwidth of the baseband signal, and P is the average input power. The combined EVM is then given by $$EVM\ (\%) = \sqrt{EVM_{nl}^2 + EVM_{noise}^2}$$

In the case of an ACPR measurement, the frequency spectrum of the DUT output is integrated across the desired channel and the adjacent channels to provide the power in each of the channels. The nonlinearity characterization function is applied to the input baseband signal data to obtain the distorted baseband signal. A random value which has Gaussian distribution with variance equal to the device noise power F is added to each sample of the distorted baseband signal. The modified baseband signal is transformed with a Fourier transform to a frequency spectrum, and the power in each of the channels is determined by summing the square of the amplitudes of the frequencies in the appropriate channels.

Figure 2:
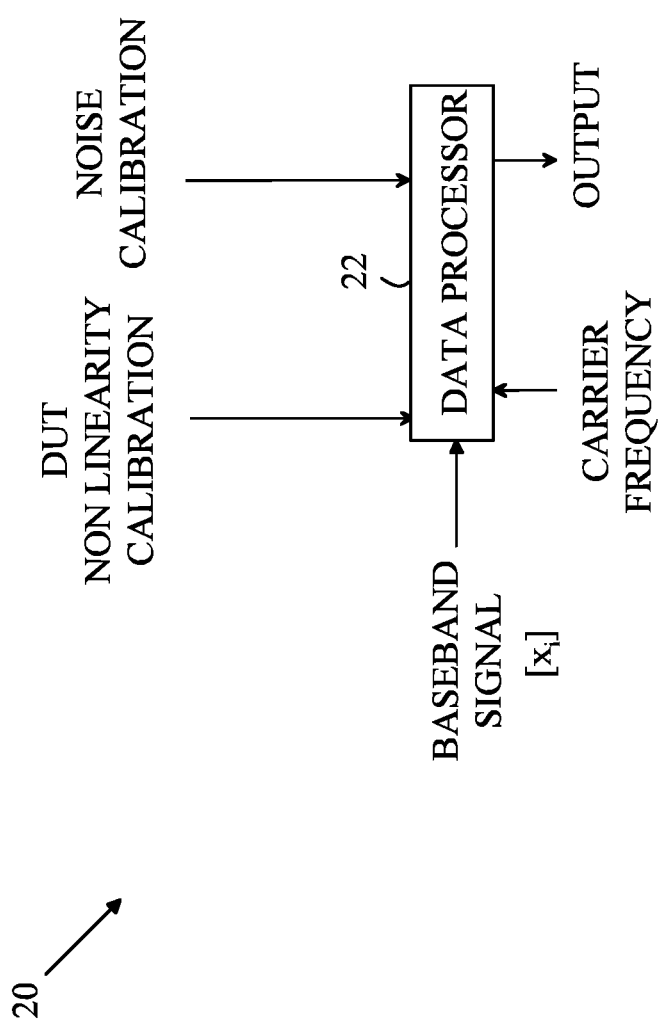
FIG. 2 illustrates a system for predicting the output of a DUT to a baseband signal that has been up-converted to a carrier frequency.

Refer now to FIG. 2, which illustrates a system 20 for predicting the output of a DUT to a baseband signal that has been up-converted to a carrier frequency. Data processing system 22 uses characterization data for the non-linearity of the DUT at the carrier frequency and the noise introduced by the DUT at the carrier frequency. The characterization data can be provided by the user of system 20 or generated by data processing system 22 using a vector network analyzer that is part of data processing system 22. In one aspect of the invention, the manufacturer of the DUT provides the characterization data in the form of a table or a set of coefficients that characterize the complex gain of the DUT. Data processing system 22 also receives the baseband signal that is to be used to calculate the desired performance parameters such as the EVM or ACPR of the device at the carrier frequency, which is also inputted to data processing system 22. Data processing system 22 then uses the above-described methods to provide the desired parameters and/or the transformed baseband signal.

The above-described embodiments assume that the characterization data for the DUT can be fitted to the function $C(x)$ discussed above. The function $C(x)$ is a complex valued function that specifies the gain of the DUT and the amount of phase shift introduced by the DUT when a signal of amplitude x is input to the DUT at the carrier frequency. In one aspect of the invention, $C(x)$ is modeled as a complex valued polynomial of the form $$C(x) = \sum_{k=0}^{\infty} g_k x^k$$

Here, the $g_k$ are complex-valued constants.

In another aspect of the invention, $C(x)$ is computed by interpolating a table of characterization values in which each entry comprises a measurement of the DUT gain as a function of the amplitude of x and a measurement of the phase shift introduced by the DUT.

In the above-described method for computing EVM, the reference signal for a point $x_i$ is calculated as $gx_i$ where g is the small signal gain of the DUT. This assumes that there is a region of the inputs to the DUT in which the DUT has a constant gain. In some cases, the DUT does not exhibit a constant gain even for small amplitude x values. In this case, a gain, $g_{norm}$, is computed by finding the value of $g_{norm}$ that minimizes the function $$\sum_{n=1}^{N} \left| \sum_{k=0}^{K} g_k x_n^k - g_{norm} x_n \right|^2$$

This value of $g_{norm}$ is then used in place of g.

The present invention also includes a computer readable medium that stores instructions that cause a data processing system to execute the method of the present invention. A computer readable medium is defined to be any medium that constitutes patentable subject matter under 35 U.S.C. 101 and excludes any medium that does not constitute patentable subject matter under 35 U.S.C. 101. Examples of patentable media include non-transitory media such as computer memory devices that store information in a format that is readable by a computer or data processing system.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method for operating a data processing system to compute a response of a DUT to a modulated input signal, said method comprising:
   determining a set of parameters for a first model of said DUT from a plurality of measurements of output values from said DUT, each output value comprising a measurement of a gain and phase shift provided by said DUT when said DUT is stimulated with a single tone input signal having a frequency in a frequency range determined by said modulated input signal;
   determining a second model that characterizes noise generated by said DUT at said single tone input signal; and
   determining a performance parameter for an output signal that would be obtained by applying said modulated input signal to an input of said DUT, and receiving said output signal from said DUT based on said first and second models.

2. The method of claim 1 wherein said first model comprises a complex polynomial series, said set of parameters being coefficients of said complex polynomial series.

3. The method of claim 1 wherein said second model comprises a noise figure or noise factor of said DUT.

4. The method of claim 1 wherein said performance parameter comprises an error vector magnitude (EVM) measurement.

5. The method of claim 1 wherein said performance parameter comprises an adjacent channel power ratio (ACPR) measurement for said modified modulated signal.

6. A non-transitory computer readable medium comprising instructions that cause a data processing system to execute a method to compute a response of a DUT to a modulated input signal, said method causes said data processing system to:
   determine a set of parameters for a first model of said DUT from a plurality of measurements of output values from a said DUT, each output value comprising a measurement of a gain and phase shift provided by said DUT when said DUT is stimulated with a single tone input signal having a frequency in a frequency range determined by said modulated input signal;
   determine a second model that characterizes noise generated by said DUT at said single tone input signal; and
   determine a performance parameter for an output signal that would be obtained by applying a said modulated input signal to an input of said DUT, and receiving said output of said DUT based on said first and second models.

7. The non-transitory computer readable medium of claim 6 wherein said first model comprises a complex polynomial series, said set of parameters being coefficients of said complex polynomial series.

8. The non-transitory computer readable medium of claim 6 wherein said second model comprises a noise figure or noise factor of said DUT.

9. The non-transitory computer readable medium of claim 6 wherein said performance parameter comprises an error vector magnitude (EVM) measurement.

10. The non-transitory computer readable medium of claim 6 wherein said performance parameter comprises an adjacent channel power ratio (ACPR) measurement for said modified modulated signal.

* * * * *